United States Patent
Yang

(10) Patent No.: US 12,027,233 B2
(45) Date of Patent: Jul. 2, 2024

(54) WORDLINE DRIVER CIRCUIT AND MEMORY

(71) Applicant: CHANGXIN MEMORY TECHNOLOGIES, INC., Hefei (CN)

(72) Inventor: Guifen Yang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 267 days.

(21) Appl. No.: 17/842,806

(22) Filed: Jun. 17, 2022

(65) Prior Publication Data

US 2023/0031454 A1 Feb. 2, 2023

Related U.S. Application Data

(63) Continuation of application No. PCT/CN2021/117276, filed on Sep. 8, 2021.

(30) Foreign Application Priority Data

Jul. 29, 2021 (CN) .......................... 202110866691.3
Aug. 30, 2021 (CN) .......................... 202111007287.7

(51) Int. Cl.
*G11C 8/14* (2006.01)
*G11C 8/08* (2006.01)

(52) U.S. Cl.
CPC ..................................... *G11C 8/08* (2013.01)

(58) Field of Classification Search
CPC .................................. G11C 8/08; G11C 8/14
See application file for complete search history.

(56) References Cited

U.S. PATENT DOCUMENTS

| | | | |
|---|---|---|---|
| 9,583,152 B1 | 2/2017 | Jeong | |
| 2002/0140015 A1* | 10/2002 | Kitsukawa | G11C 5/025 257/296 |
| 2007/0241810 A1* | 10/2007 | Onda | G11C 11/4094 327/544 |
| 2011/0032786 A1 | 2/2011 | Yang et al. | |
| 2017/0005096 A1* | 1/2017 | Lee | H01L 27/105 |
| 2018/0166119 A1 | 6/2018 | Jeong | |
| 2020/0051611 A1* | 2/2020 | Jeong | H01L 27/0207 |

(Continued)

FOREIGN PATENT DOCUMENTS

| | | |
|---|---|---|
| CN | 103165174 A | 6/2013 |
| CN | 109935258 A | 6/2019 |
| JP | 2003007852 A | 1/2003 |

*Primary Examiner* — Hien N Nguyen
(74) *Attorney, Agent, or Firm* — Kilpatrick Townsend & Stockton LLP

(57) ABSTRACT

Embodiments provide a wordline driver circuit and a memory. The wordline driver circuit at least includes a first type of wordline drivers and a second type of wordline drivers, wherein each of the wordline drivers includes a PMOS transistor and an NMOS transistor. A first type of PMOS transistors in the first type of wordline drivers and a second type of PMOS transistors in the second type of wordline drivers are configured to receive different first control signals. The first type of PMOS transistors and the second type of PMOS transistors are arranged side by side, a part of the NMOS transistors in the first type of wordline drivers and the second type of wordline drivers are positioned on a side of the first type of PMOS transistors and the second type of PMOS transistors.

18 Claims, 8 Drawing Sheets

(56) References Cited

U.S. PATENT DOCUMENTS

| | | | |
|---|---|---|---|
| 2021/0057008 A1* | 2/2021 | Kim | G11C 8/08 |
| 2023/0005519 A1* | 1/2023 | Miyatake | G11C 8/14 |
| 2023/0030836 A1* | 2/2023 | Yang | G11C 8/14 |

* cited by examiner

US 12,027,233 B2

1

WORDLINE DRIVER CIRCUIT AND MEMORY

CROSS-REFERENCE TO RELATED APPLICATION

This application is a continuation of PCT/CN2021/117276, filed on Sep. 8, 2021, which claims priority to Chinese Patent Application No. 202110866691.3 filed on Jul. 29, 2021 and Chinese Patent Application No. 202111007287.7, filed on Aug. 30, 2021, titled "WORDLINE DRIVER CIRCUIT AND MEMORY", the entire contents of which are incorporated herein by reference.

TECHNICAL FIELD

Embodiments of the present disclosure relate to a wordline driver circuit and a memory.

BACKGROUND

Various circuits in a memory need to use various signals, and signal drivers configured to apply the signals to signal lines are universally used. A wordline driver is configured to apply voltages to wordlines in a memory cell array, and the wordlines can extend from a sub wordline driver (SWD) and pass through the memory cell array. The SWD can selectively activate corresponding wordlines in response to receiving row addresses corresponding to the wordlines by a memory device, such that each memory cell connected to the activated wordlines can output or input data.

SUMMARY

According to some embodiments of the present disclosure, one aspect of the embodiments of the present disclosure provides a wordline driver circuit, which at least includes a first type of wordline drivers and a second type of wordline drivers, wherein each of the wordline drivers includes a P-channel metal oxide semiconductor (PMOS) transistor and an N-channel metal oxide semiconductor (NMOS) transistor. A first type of PMOS transistors in the first type of wordline drivers and a second type of PMOS transistors in the second type of wordline drivers are configured to receive different first control signals. The first type of PMOS transistors and the second type of PMOS transistors are arranged side by side, a part of the NMOS transistors in the first type of wordline drivers and the second type of wordline drivers are positioned on a side of the first type of PMOS transistors and the second type of PMOS transistors, and other part of the NMOS transistors in the first type of wordline drivers and the second type of wordline drivers are positioned on other side of the first type of PMOS transistors and the second type of PMOS transistors.

According to some embodiments of the present disclosure, another aspect of the embodiments of the present disclosure also provides a memory, which includes the above-mentioned wordline driver circuit.

BRIEF DESCRIPTION OF THE DRAWINGS

Exemplary descriptions of one or more embodiments are made by means of pictures in corresponding drawings, and these exemplary descriptions do not constitute a limitation on the embodiments. Unless otherwise stated, the pictures in the drawings do not constitute a scale limitation.

2

Figure 1:
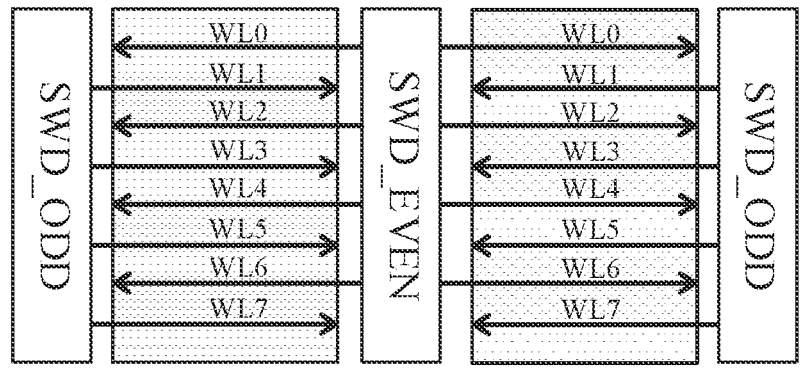
Figure 2:
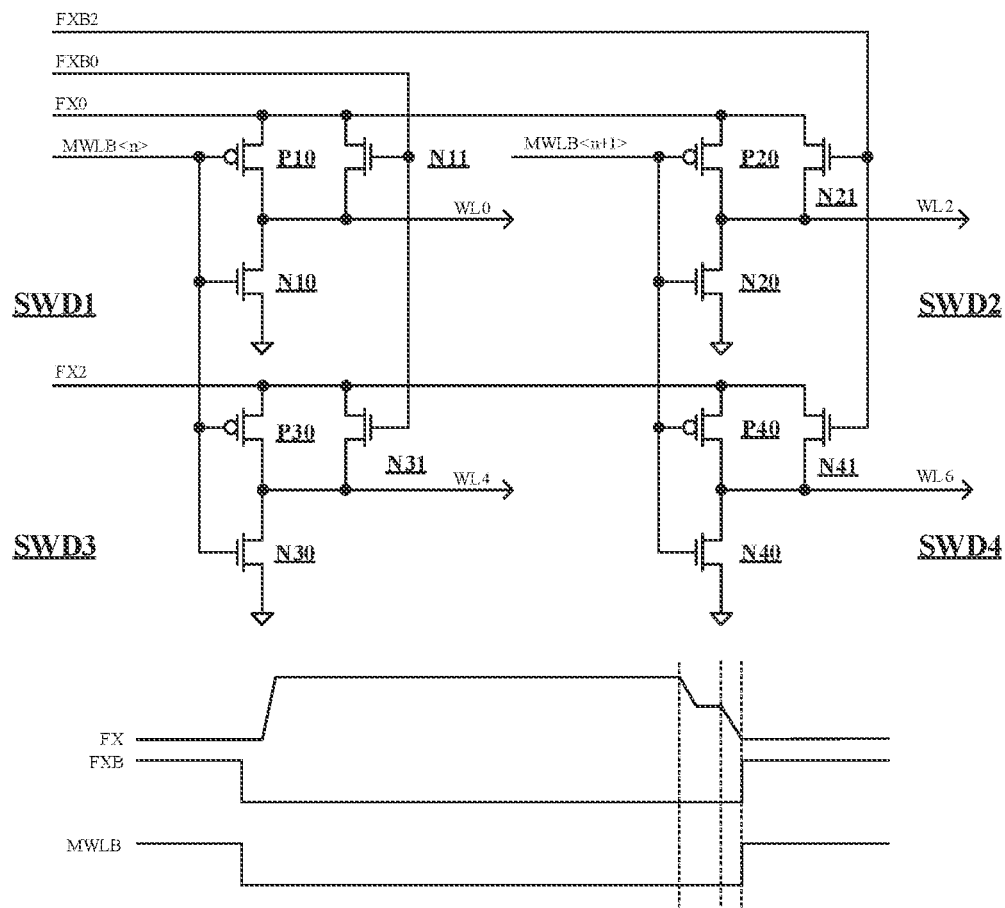

FIG. 1 is a schematic structural diagram of a memory according to an embodiment of the present disclosure;

FIG. 2 is a schematic structural diagram of a wordline driver circuit according to an embodiment of the present disclosure; and FIGS. 3 to 9 are schematic diagrams of a layout structure of the wordline driver circuit according to embodiments of the present disclosure.

DETAILED DESCRIPTION

The embodiments of the present disclosure will be described in detail below in conjunction with the accompanying drawings. However, a person of ordinary skill in the art may understand that in each embodiment of the present disclosure, many technical details are put forward such that a reader may better understand the present disclosure. However, the technical solutions requested to be protected by the present disclosure may also be implemented even without these technical details or various variations and modifications based on the following embodiments.

FIG. 1 is a schematic structural diagram of a memory according to an embodiment of the present disclosure; FIG. 2 is a schematic structural diagram of a wordline driver circuit according to an embodiment of the present disclosure; and FIGS. 3 to 9 are schematic diagrams of a layout structure of the wordline driver circuit according to the embodiments of the present disclosure.

The wordline driver circuit includes a first type of wordline drivers and a second type of wordline drivers, wherein each of the wordline drivers includes a PMOS transistor and an NMOS transistor. A first type of PMOS transistors in the first type of wordline drivers and a second type of PMOS transistors in the second type of wordline drivers are configured to receive different first control signals. The first type of PMOS transistors and the second type of PMOS transistors are arranged side by side, a part of the NMOS transistors in the first type of wordline drivers and the second type of wordline drivers are positioned on a side of the first type of PMOS transistors and the second type of PMOS transistors, and other part of the NMOS transistors in the first type of wordline drivers and the second type of wordline drivers are positioned on other side of the first type of PMOS transistors and the second type of PMOS transistors.

The embodiments of the present disclosure will be described in more detail below in conjunction with the accompanying drawings.

Referring to FIG. 1, according to different wordlines connected, the wordline drivers may be classified into odd wordline drivers SWD_ODD and even wordline drivers SWD_EVEN. The odd wordline drivers SWD_ODD are configured to connect odd wordlines (such as WL1, WL3, WL5, and WL7), and the even wordline drivers SWD_EVEN are configured to connect even wordlines (such as WL0, WL2, WL4, and WL6). In a memory device, the odd wordline drivers SWD_ODD and the even wordline drivers SWD_EVEN are generally arranged at intervals, and the odd wordlines and the even wordlines are generally arranged at intervals.

Referring to FIG. 1 and FIG. 2, description is made by taking an example where each wordline driver circuit includes four wordline drivers. As can be seen from the figures, different wordline drivers in the same wordline driver circuit are of the same type, that is, they are all odd wordline drivers or even wordline drivers. Each of the wordline drivers may include one PMOS transistor and two NMOS transistors, which are respectively denoted as a zeroth PMOS transistor, a zeroth NMOS transistor, and a first NMOS transistor. A gate of the zeroth PMOS transistor and a gate of the zeroth NMOS transistor are configured to receive a first control signal MWLB (for example, MWLB<n> or MWLB<n+1>). A source of the zeroth PMOS transistor and a source of the first NMOS transistor are configured to receive a second control signal FX (for example, FX0 or FX2). A drain of the zeroth PMOS transistor, a drain of the zeroth NMOS transistor, and a drain of the first NMOS transistor are configured to connect the corresponding wordlines (such as WL0, WL2, WL4, and WL6). A source of the zeroth NMOS transistor is grounded or connected to a low-level signal. A gate of the first NMOS transistor is configured to receive a second complementary control signal FXB (for example, FXB0 or FXB2).

A moment when the first control signal MWLB transitions to a low level is the same as a moment when the second control complementary signal FXB transitions to a low level. A moment when the second control signal FX starts to step up is later than a moment when the second control complementary signal FXB transitions to a low level. A moment when the first control signal MWLB transitions to a high level is the same as a moment when the second control complementary signal FXB transitions to a high level. A moment when the second control signal FX starts to step down is earlier than a moment when the second control complementary signal FXB transitions to a high level. In a process when the second control signal FX drops to a lower level, the second control signal FX stays at an intermediate level for a preset period of time, and a moment when the second control signal FX transitions to a low level is the same as a moment when the second control complementary signal FXB transitions to a high level.

Exemplarily, the wordline driver circuit includes a first wordline driver SWD1, a second wordline driver SWD2, a third wordline driver SWD3, and a fourth wordline driver SWD4. The first wordline driver SWD1 includes a PMOS transistor P10 and two NMOS transistors N10 and N11, the second wordline driver SWD2 includes a PMOS transistor P20 and two NMOS transistors N20 and N21, the third wordline driver SWD3 includes a PMOS transistor P30 and two NMOS transistors N30 and N31, and the fourth wordline driver SWD4 includes a PMOS transistor P40 and two NMOS transistors N40 and N41. P10, P20, P30, and P40 are the zeroth PMOS transistors, N10, N20, N30, and N40 are the zeroth NMOS transistors, and N11, N21, N31, and N41 are the first NMOS transistors.

As can be known from the contents as shown in FIG. 2, the first wordline driver SWD1 and the third wordline driver SWD3 are configured to receive the same first control signal MWLB and the same second control complementary signal FXB, i.e., MWLB<n> and FXB0. The second wordline driver SWD2 and the fourth wordline driver SWD4 are configured to receive another first control signal MWLB and another second control complementary signal FXB, i.e., MWLB<n> and FXB2. The first wordline driver SWD1 and the second wordline driver SWD2 are configured to receive the same second control signal FX, i.e., FX0. The third wordline driver SWD3 and the fourth wordline driver SWD4 are configured to receive another second control signal FX, i.e., FX2. Wordlines connected to different wordline drivers are different. According to a fact whether the received first control signals MWLB are the same, the wordline drivers may be classified into a first type of wordline drivers and a second type of wordline drivers. The first type of wordline drivers include a first wordline driver and a third wordline driver, and the second type of wordline drivers include a second wordline driver and a fourth wordline driver.

In some embodiments, each PMOS transistor comprises at least two sub PMOS transistors. In some other embodiments, each NMOS transistor comprises at least two sub NMOS transistors. In yet other embodiments, each PMOS transistor comprises at least two sub PMOS transistors, and each NMOS transistor is constituted by at least two sub NMOS transistors. Exemplarily, the zeroth PMOS transistor comprises a No. 01 PMOS transistor and a No. 02 PMOS transistor, the zeroth NMOS transistor comprises a No. 01 NMOS transistor and a No. 02 NMOS transistor, and the first NMOS transistor comprises a No. 11 NMOS transistor and a No. 12 NMOS transistor. It is to be noted that in the embodiments of the present disclosure, the No. 01 PMOS transistor and the No. 02 PMOS transistor are NMOS transistors with exactly the same physical characteristics, and differences between the No. 01 PMOS transistor and the No. 02 PMOS transistor lie only in their different locations and different connection relationships with other components. Similarly, the first NMOS transistor, the No. 12 NMOS transistor, the No. 01 NMOS transistor and the No. 02 NMOS transistor are NMOS transistors with exactly the same physical characteristics, and the differences lie only in their different locations and different connection relationships with other components. Jointly constituting a PMOS or NMOS transistor by two sub MOS transistors is advantageous to adjust arrangement of layout.

In addition, for the sake of brevity of illustration, FIGS. 3-9 do not mark each transistor or sub transistor. Those skilled in the art may determine, according to the signals received by the gates, the sources and the drains of different transistors in FIG. 2, which transistors or which sub transistors are represented by the transistors in different locations in FIGS. 3-9.

Figure 3:
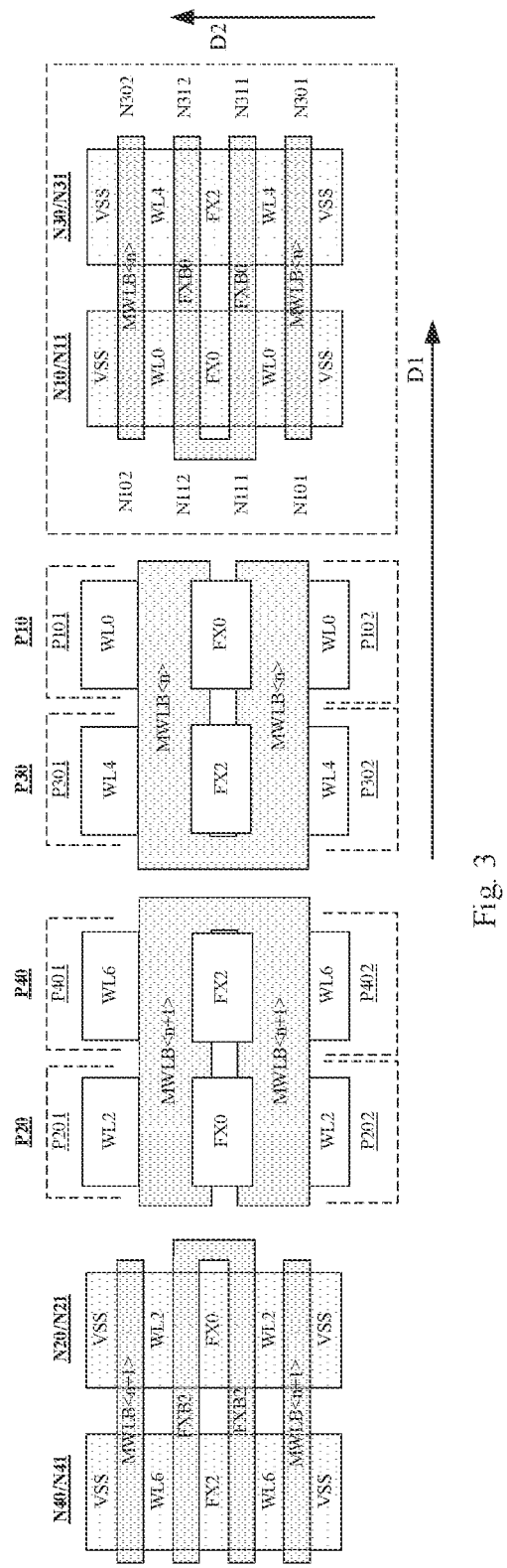

Referring to FIG. 3, the PMOS transistors P10 and P30 in the first type of wordline drivers are arranged side by side with the PMOS transistors P20 and P40 in the second type of wordline drivers. The NMOS transistors N10, N11, N30 and N31 included in the first type of wordline drivers are positioned on a side of the PMOS transistors, and the NMOS transistors N20, N21, N40 and N41 included in the second type of wordline drivers are positioned on an opposite side of the PMOS transistors.

In some embodiments, each of the PMOS transistors comprises at least two sub PMOS transistors. Referring to FIG. 3, the PMOS transistor P10 comprises P101 and P102, the PMOS transistor P20 comprises P201 and P202, the PMOS transistor P30 comprises P301 and P302, and the PMOS transistor P40 comprises P401 and P402. Positional relationships between the sub PMOS transistors in different PMOS transistors are similar, and the positional relationship between P10 and P30 is similar to the positional relationship between P20 and P40. For this reason, P10 and P30 are employed to make an exemplary description in the following.

In some embodiments, an arrangement direction of the first type of PMOS transistors and the second type of PMOS transistors is perpendicular to a channel length direction of the PMOS transistors. As can be seen from the embodiment as shown in FIG. 3, the first type of PMOS transistors comprising P10 and P30 and the second type of PMOS transistors comprising P20 and P40 are arranged along a first direction D1, the channel length direction of the PMOS transistors is a second direction D2, and the second direction D2 is perpendicular to the first direction D1. It is to be noted that when discussing the arrangement direction of the first type of PMOS transistors and the second type of PMOS transistors, P10 and P30 should be treated as a whole, and P20 and P40 also should be treated as a whole.

In some embodiments, the arrangement direction of the two sub PMOS transistors is parallel to the channel length direction of the PMOS transistor. Taking the first wordline driver as an example, the arrangement direction of P101 and P102 is the second direction D2. For this reason, it may be considered that the channel length direction of the PMOS transistor P10 constituted by P101 and P102 is the second direction D2. That is, the arrangement direction of P101 and P102 is parallel to the channel length direction of P10.

In some embodiments, two sub PMOS transistors share the same source. As can be seen from contents as shown in FIGS. 3, P101 and P102 share the same source, which is an independent and continuous active region configured to receive the second control signal FX, i.e., FX0. Similarly, P201 and P202 constituting the PMOS transistor P20, P301 and P302 constituting the PMOS transistor P30, and P401 and P402 constituting the PMOS transistor P40 all share an independent active region, which serves as a source to receive the corresponding second control signal FX.

In some embodiments, the first type of wordline drivers include a first wordline driver and a third wordline driver, wherein the first wordline driver includes a first PMOS transistor, and the third wordline driver includes a third PMOS transistor. The arrangement direction of the first PMOS transistor and the third PMOS transistor is perpendicular to the channel length direction of the PMOS transistors. If each of the wordline drivers only includes one PMOS transistor, the first PMOS transistor is the PMOS transistor P10, the third PMOS transistor is the PMOS transistor P30, and the arrangement direction of P10 and P30 is the first direction D1. In addition, in this embodiment, different PMOS transistors have the same channel length directions, i.e., the second direction D2. Therefore, the arrangement direction of P10 and P30 is perpendicular to the arrangement direction of the PMOS transistors.

Similarly, the second type of wordline drivers include a second wordline driver and a fourth wordline driver, wherein the second wordline driver includes a second PMOS transistor, and the fourth wordline driver includes a fourth PMOS transistor. The arrangement direction of the second PMOS transistor and the fourth PMOS transistor is perpendicular to the channel length direction of the PMOS transistors. Taking an example where each of the wordline drivers includes one PMOS transistor and the channel length direction of each PMOS transistor is the second direction D2, the second PMOS transistor serves as the PMOS transistor P20, the fourth PMOS transistor serves as the PMOS transistor P40, the arrangement direction of P20 and P40 is the first direction D1, and the arrangement direction of P20 and P40 is perpendicular to the channel length direction of the PMOS transistor.

In some embodiments, the first PMOS transistor and the third PMOS transistor share the same gate. As can be seen from the above contents, the first PMOS transistor is P10, the third PMOS transistor is P30, P10 and P30 share the same gate, and P101 and P102 constituting P10 share the same gate with P301 and P302 constituting P30. The gate may have a single-layer structure or a multi-layer structure, and a material of the gate may include at least one of doped polysilicon or a metal material.

Similarly, the second PMOS transistor and the fourth PMOS transistor share the same gate. Referring to FIGS. 3, P20 and P40 share the same gate, and P201 and P202 constituting P20 share the same gate with P401 and P402 constituting P40.

It is assumed that the PMOS transistors in the wordline driver circuit have the same channel length direction, and that the NMOS transistors in the wordline driver circuit have the same channel length direction. In some embodiments, the channel length direction of the PMOS transistors is parallel to the channel length direction of the NMOS transistors, referring to FIGS. 3 to 6. In some other embodiments, the channel length direction of the PMOS transistors is perpendicular to the channel length direction of the NMOS transistors, referring to FIG. 7 and FIG. 8. The details are as follows.

Figure 7:
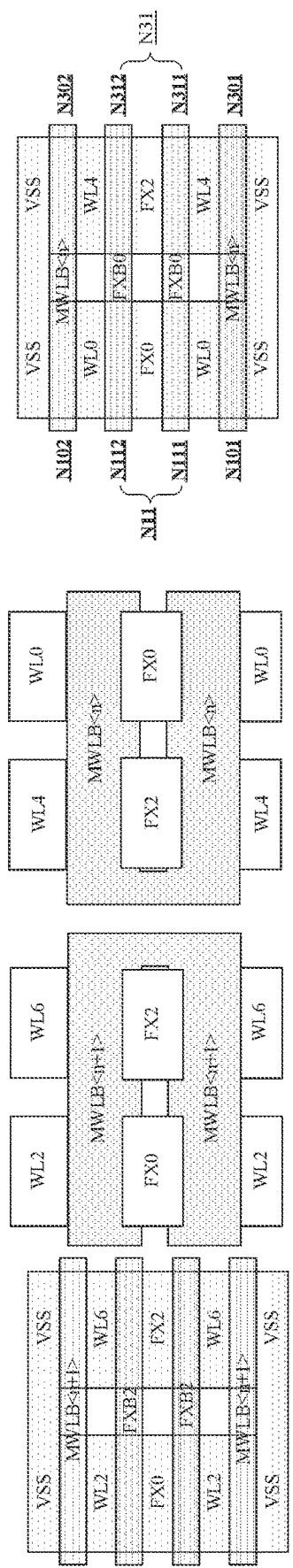

Adjustment of the embodiment as shown in FIG. 7 with respect to the embodiment as shown in FIG. 3 includes: rotating the NMOS transistors, such that the channel length direction of the NMOS transistors is perpendicular to the channel length direction of the PMOS transistors; controlling N101 and N301 to share the same source, and controlling N102 and N302 to share the same source; and using relatively independent different conductive layers as the gate of the No. 11 NMOS transistor N111/N311 and the gate of the No. 12 NMOS transistor N112/N312.

Figure 6:
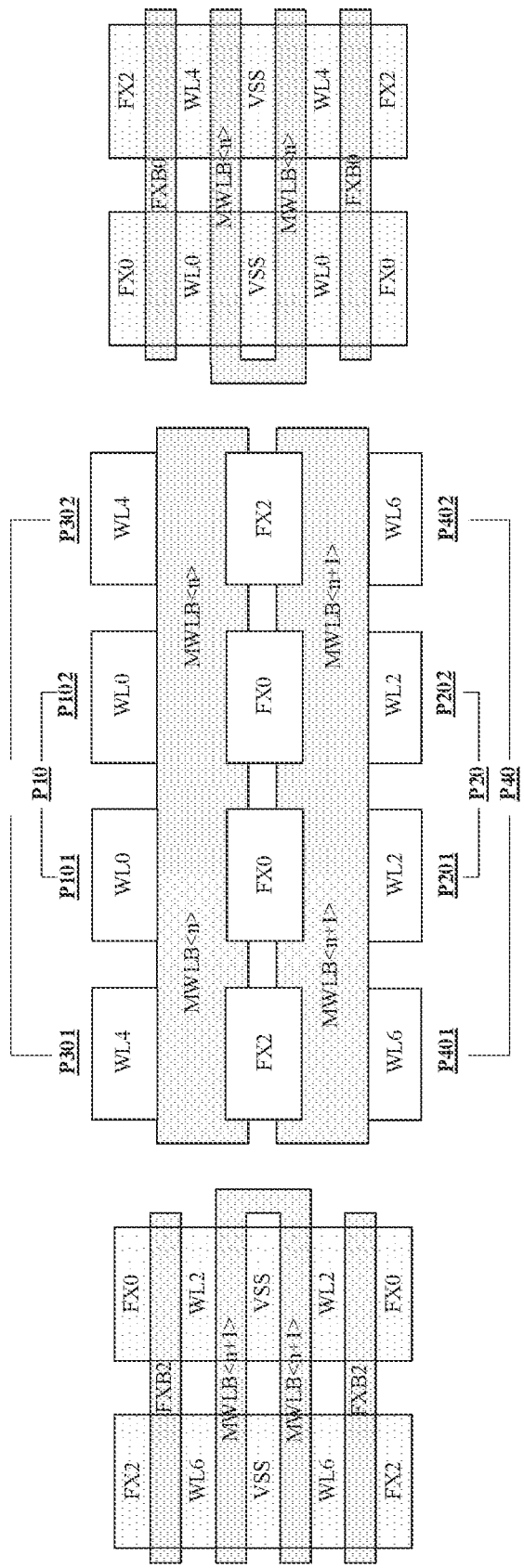
Figure 8:
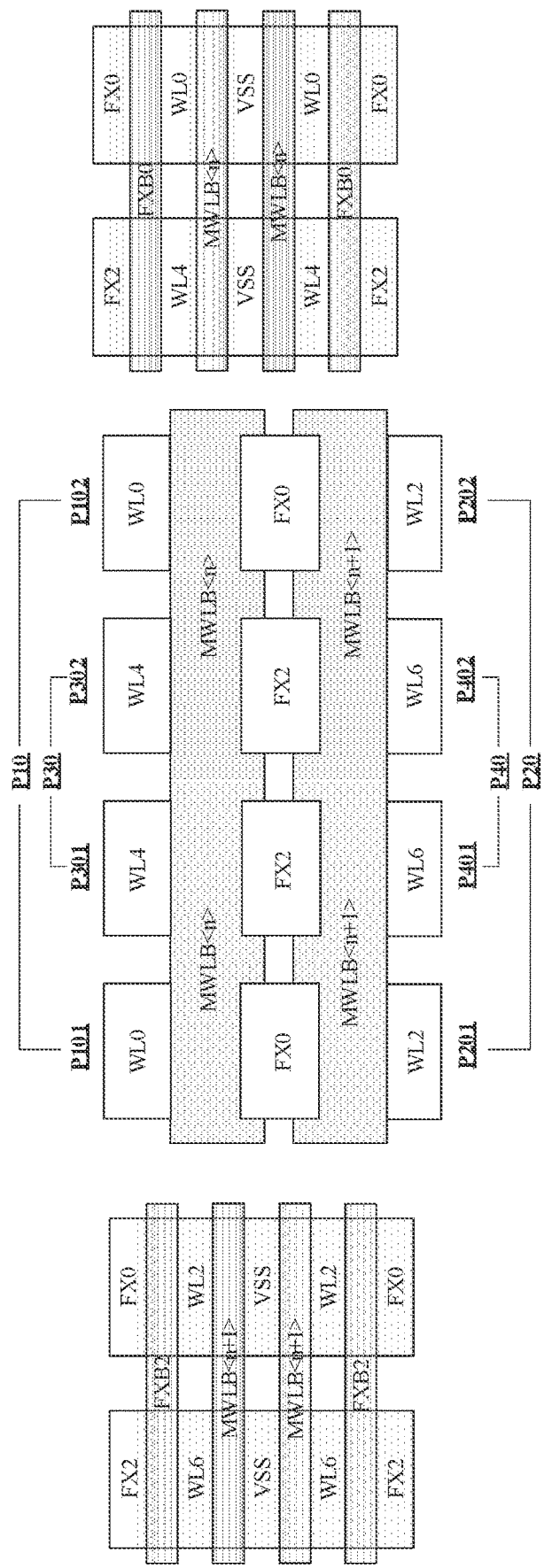

Adjustment of the embodiment as shown in FIG. 8 with respect to the embodiment as shown in FIG. 6 includes: rotating the NMOS transistors, such that the channel length direction of the NMOS transistors is perpendicular to the channel length direction of the PMOS transistors. In addition, a No. 31 PMOS transistor and a No. 32 PMOS transistor are both provided between the No. 11 PMOS transistor and the No. 12 PMOS transistor, and a No. 41 PMOS transistor and a No. 42 PMOS transistor are both provided between the No. 21 PMOS transistor and the No. 22 PMOS transistor. That is, P301 and P302 are positioned between P101 and P102, and P401 and P402 are positioned between P201 and In some embodiments, the No. 11 NMOS transistor and the No. 12 NMOS transistor are positioned between the No. 01 NMOS transistor and the No. 02 NMOS transistor. Referring to FIG. 3, an internal arrangement mode of the NMOS transistors of different wordline drivers is the same. Taking the first wordline driver as an example, the first NMOS transistor N11 in the first wordline driver comprises the No. 11 NMOS transistor N111 and the No. 12 NMOS transistor. The zeroth NMOS transistor N10 comprises the No. 01 NMOS transistor N101 and the No. 02 NMOS transistor N102, and N111 and N112 are positioned between N101 and N102.

The arrangement direction of the No. 11 NMOS transistor and the No. 12 NMOS transistor is parallel to the arrangement direction of the No. 01 NMOS transistor and the No. 02 NMOS transistor. Similarly, taking the first wordline driver as an example, the arrangement direction of N111 and N112 is parallel to the arrangement direction of N101 and N102. When the channel length direction of the PMOS transistors is the same as the channel length direction of the NMOS transistors, the arrangement direction of the two sub PMOS transistors is set to be parallel to the arrangement direction of the two sub NMOS transistors, which is beneficial to ensure pitches from the PMOS transistors in the same wordline driver to each of the sub NMOS transistors to be equal, such that the wordline drivers have more balanced properties.

In addition, the No. 01 NMOS transistor and the No. 11 NMOS transistor share the same drain, the No. 11 NMOS transistor and the No. 12 NMOS transistor share the same source, and the No. 12 NMOS transistor and the No. 02 NMOS transistor share the same drain. Corresponding to FIGS. 3, N101 and N111 share the same active region, which is connected to the zeroth wordline WL0 through a contact hole. N111 and N112 share the same active region, which is configured to receive the first control signal FX, i.e., FX0. N112 and N102 share the same active region, which is also connected to the zeroth wordline WL0 through a contact hole.

In addition, the No. 11 NMOS transistor and the No. 12 NMOS transistor share the same gate. Different transistors share the same gate, which is advantageous to reduce difficulty of fabricating the gate and to ensure electrical conductivity of the gate. In some embodiments, it is advantageous to reduce complexity of a patterned opening of a mask, to avoid occurrence of etching defects caused by complicated patterns, and to ensure effective formation of the gate. Still taking an embodiment of the first wordline as an example, N111 and N112 share the same gate. That is, the gate of N111 and the gate of N112 are different parts of the same conductive layer, and another part configured to communicate the gate of N111 with the gate of N112 is positioned on an isolation structure.

Figure 4:
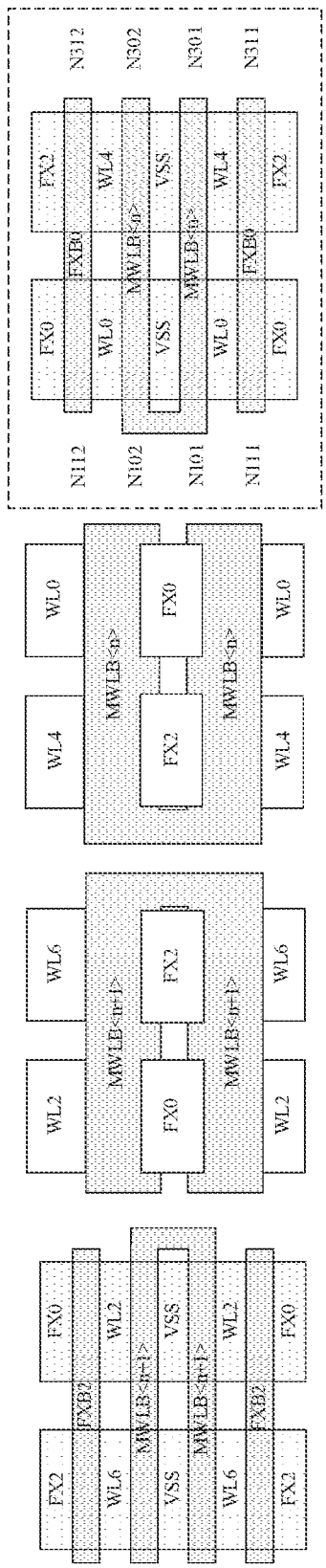

In some other embodiments, the No. 01 NMOS transistor and the No. 02 NMOS transistor are positioned between the No. 11 NMOS transistor and the No. 12 NMOS transistor, wherein the No. 01 NMOS transistor and the No. 02 NMOS transistor may share the same gate. Referring to FIG. 4, the internal arrangement modes of the NMOS transistors of different wordline drivers are the same. Taking the first wordline driver as an example, N101 and N102 are positioned between N111 and N112, and N101 and N102 share the same gate.

Similar to the previous embodiment, the arrangement direction of the No. 01 NMOS transistor and the No. 02 NMOS transistor positioned in a middle location is parallel to the arrangement direction of the No. 11 NMOS transistor and the No. 12 NMOS transistor positioned on two sides. Taking the first wordline driver as an example, the arrangement direction of N101 and N102 is parallel to the arrangement direction of N111 and N112.

Similarly, the No. 11 NMOS transistor and the No. 01 NMOS transistor share the same drain, the No. 01 NMOS transistor and the No. 02 NMOS transistor share the same source, and the No. 02 NMOS transistor and the No. 12 NMOS transistor share the same drain. Referring to FIGS. 4, N111 and N101 share the same active region, which is connected to the zeroth wordline WL0 through a contact hole. N101 and N102 share the same active region, which is grounded or connected to a low-level signal. N102 and N112 share the same active region, which is also connected to the zeroth wordline WL0 through the contact hole. In addition, the No. 01 NMOS transistor and the No. 02 NMOS transistor share the same gate.

In some embodiments, the first type of wordline drivers include a first wordline driver and a third wordline driver. The No. 01 NMOS transistor of the first wordline driver and the No. 01 NMOS transistor of the third wordline driver share the same gate. That is, N101 and N301 share the same gate. The No. 11 NMOS transistor of the first wordline driver and the No. 11 NMOS transistor of the third wordline driver share the same gate. That is, N111 and N311 share the same gate. The No. 12 NMOS transistor of the first wordline driver and the No. 12 NMOS transistor of the third wordline driver share the same gate. That is, N112 and N312 share the same gate. The No. 02 NMOS transistor of the first wordline driver and the No. 02 NMOS transistor of the third wordline driver share the same gate. That is, N102 and N302 share the same gate.

Figure 5:
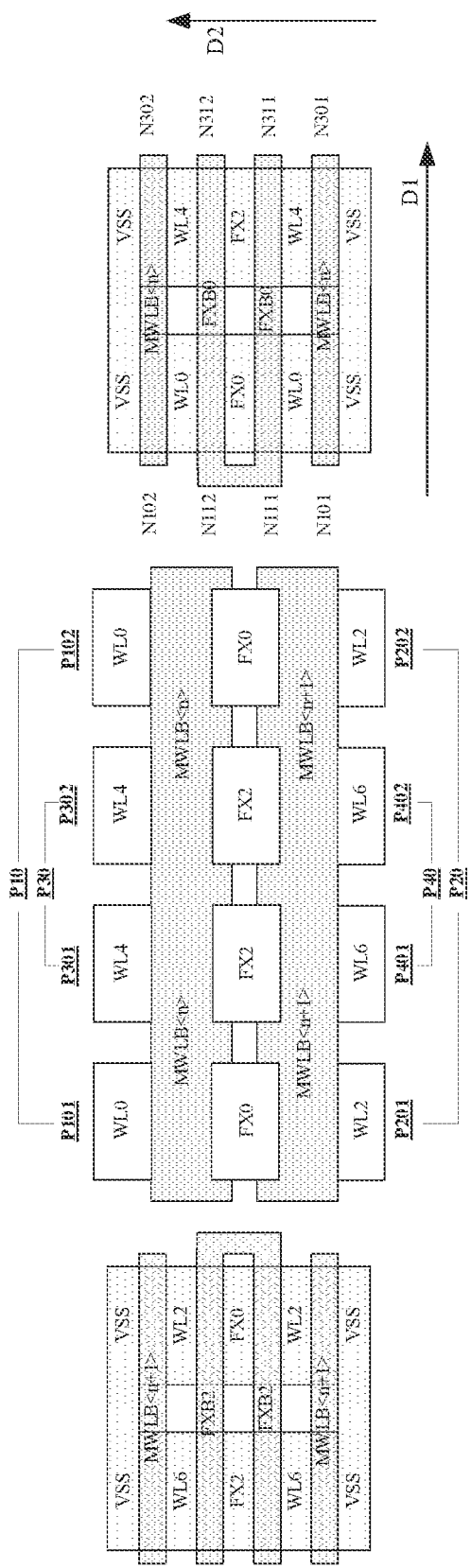

In some embodiments, taking FIG. 5 as an example, the No. 01 NMOS transistor of the first wordline driver and the No. 01 NMOS transistor of the third wordline driver share the same source, and the No. 02 NMOS transistor of the first wordline driver and the No. 02 NMOS transistor of the third wordline driver share the same source. That is, N101 and N301 share the same source, and N102 and N302 share the same source.

The first type of wordline drivers include a first wordline driver and a third wordline driver, and the second type of wordline drivers include a second wordline driver and a fourth wordline driver. The first PMOS transistor included in the first wordline driver and the second PMOS transistor included in the second wordline driver share the same source. That is, P10 and P20 share the same source. The third PMOS transistor included in the third wordline driver shares the same source with the fourth PMOS transistor included in the fourth wordline driver. That is, P30 and P40 share the same source.

In some embodiments, the first PMOS transistor comprises the No. 11 PMOS transistor and the No. 12 PMOS transistors, and the third PMOS transistor comprises the No. 31 PMOS transistor and the No. 32 PMOS transistors. The gate of the No. 11 PMOS transistor, the gate of the No. 12 PMOS transistor, the gate of the No. 31 PMOS transistor, and the gate of the No. 32 PMOS transistor are on the same straight line. Referring to FIG. 5, the PMOS transistor P10 comprises P101 and P102, and the PMOS transistor P30 comprises P301 and P302. The gate of P101, the gate of P102, the gate of P301, and the gate of P302 are on the same straight line.

Correspondingly, the second PMOS transistor comprises the No. 21 PMOS transistor and the No. 22 PMOS transistor, and the fourth PMOS transistor comprises the No. 41 PMOS transistor and the No. 42 PMOS transistor. The No. 21 PMOS transistor and the No. 11 PMOS transistor share the same source, the No. 22 PMOS transistor and the No. 12 PMOS transistor share the same source, the No. 41 PMOS transistor and the No. 31 PMOS transistor share the same source, and the No. 42 PMOS transistor and the No. 32 PMOS transistor share the same source. Referring to FIG. 5, the PMOS transistor P20 comprises P201 and P202, the PMOS transistor P40 comprises P401 and P402. P201 and P101 share the same source, P202 and P102 share the same source, P401 and P301 share the same source, and P402 and P302 share the same source.

In some embodiments, the No. 31 PMOS transistor and the No. 32 PMOS transistor are both positioned between the No. 11 PMOS transistor and the No. 12 PMOS transistor. Accordingly, the No. 41 PMOS transistor and the No. 42 PMOS transistor are both positioned between the No. 21 PMOS transistor and the No. 22 PMOS transistor. Referring to FIGS. 5, P301 and P302 are both positioned between P101 and P102, and P401 and P402 are both positioned between P201 and P202.

In some other embodiments, the No. 11 PMOS transistor and the No. 12 PMOS transistor are both positioned between the No. 31 PMOS transistor and the No. 32 PMOS transistor. Accordingly, the No. 21 PMOS transistor and the No. 22 PMOS transistor are both positioned between the No. 41 PMOS transistor and the No. 42 PMOS transistor. Referring to FIGS. 6, P101 and P102 are both positioned between P301 and P302, and P201 and P202 are both positioned between P401 and P402.

Figure 9:
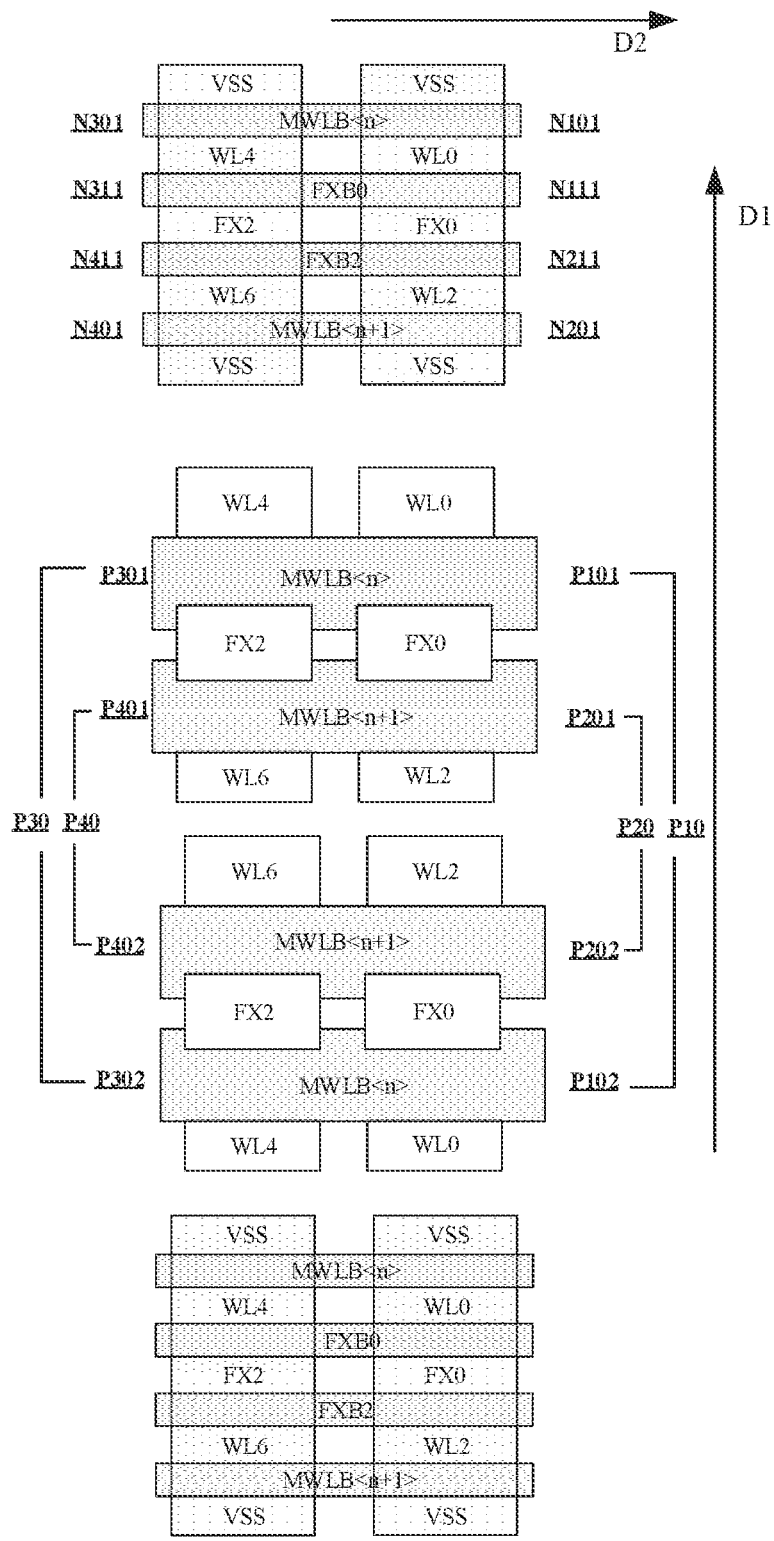

In some embodiments, the arrangement direction of the first type of PMOS transistors and the second type of PMOS transistors is parallel to the channel length direction of the PMOS transistors and the channel length direction of the NMOS transistors. Referring to FIG. 9, the first type of PMOS transistors comprising P10 and P30 and the second type of PMOS transistors comprising P20 and P40 are arranged side by side along the first direction D1. Furthermore, the channel length direction of each of the sub transistors is the first direction D1, so the channel length direction of the PMOS transistors and NMOS transistors constituted by the sub transistors is also the first direction D1. That is, the arrangement direction of the first type of PMOS transistors and the arrangement direction of the second type of PMOS transistors are parallel to the channel length direction of the PMOS transistors and the channel length direction of the NMOS transistors.

In some embodiments, referring to FIG. 9, each NMOS transistor comprises two sub NMOS transistors, which are denoted as the first sub NMOS transistor and the second sub NMOS transistor. All the first sub NMOS transistors N101, N111, N211, N201, N301, N311, N411, and N401 included in the first type of wordline drivers and the second type of wordline drivers are positioned on one side of the PMOS transistors. All the second sub NMOS transistors N102, N112, N212, N202, N302, N312, N412, and N402 included in the first type of wordline drivers and the second type of wordline drivers are positioned on an opposite side of the PMOS transistors. In some embodiments, the first sub NMOS transistors N101, N111, N301 and N311 included in the first type of wordline drivers and the second sub NMOS transistors N211, N201, N411 and N401 included in the second type of wordline drivers are arranged side by side along the first direction D1, i.e., arranged side by side along the channel length direction of the NMOS transistors or PMOS transistor, or arranged side by side along the arrangement direction of the first type of PMOS transistors or second type of PMOS transistors.

A connection relationship between sub PMOS transistors included in different PMOS transistors is as follows: P101 and P301 are arranged side by side along the second direction D2 and share the same gate, P201 and P401 are arranged side by side along the second direction D2 and share the same gate, P101 and P201 share the same source, and P301 and P401 share the same source. A connection relationship between other sub PMOS transistors included in different PMOS transistors is the same as above, and thus is not described any more here.

In addition, a connection relationship between the sub NMOS transistors included in different NMOS transistors is as follows. The first sub NMOS transistor of the first wordline driver shares the same gate with the first sub NMOS transistor of the third wordline driver, and the first sub NMOS transistor of the second wordline driver shares the same gate with the first sub NMOS transistor of the fourth wordline driver. That is, N101 and N301 are arranged side by side along the second direction D2 and share the same gate, N111 and N311 are arranged side by side along the second direction D2 and share the same gate, N211 and N411 are arranged side by side along the second direction D2 and share the same gate, and N201 and N401 are arranged side by side along the second direction D2 and share the same gate.

In addition, the first NMOS transistor of the first wordline driver and the first NMOS transistor of the second wordline driver are positioned between the zeroth NMOS transistor of the first wordline driver and the zeroth NMOS transistor of the second wordline driver. The first NMOS transistor of the third wordline driver and the first NMOS transistor of the fourth wordline driver are positioned between the zeroth NMOS transistor of the third wordline driver and the zeroth NMOS transistor of the fourth wordline driver. That is, N101 and N111 share the same drain, N111 and N211 share the same source, N211 and N201 share the same drain, N301 and N311 share the same drain, N311 and N411 share the same source, and N411 and N401 share the same drain. A connection relationship between other sub NMOS transistors included in different NMOS transistors is the same as above, and thus is not described any more here.

In some other embodiments, the zeroth NMOS transistor of the first wordline driver and the zeroth NMOS transistor of the second wordline driver are positioned between the first NMOS transistor of the first wordline driver and the first NMOS transistor of the second wordline driver, and the zeroth NMOS transistor of the third wordline driver and the zeroth NMOS transistor of the fourth wordline driver are positioned between the first NMOS transistor of the third wordline driver and the first NMOS transistor of the fourth wordline driver. That is, N101 and N201 are positioned between N111 and N211, and N301 and N401 are positioned between N311 and N411.

In the embodiments of the present disclosure, the NMOS transistors in the wordline driver circuit are arranged on two sides of the PMOS transistors, which is beneficial to shorten the pitches between the PMOS transistors and the NMOS transistors corresponding to each of the wordline drivers, thereby shortening lengths of the wordlines connected to the PMOS transistors and the NMOS transistors, and reducing resistances of the wordlines and RC delay caused by the resistances. In addition, it is beneficial to reserve an extension space for channel lengths or gate widths of the PMOS transistors, such that it is avoidable that the channel lengths or gate widths of the PMOS transistors do not meet performance requirements because the PMOS transistors and the NMOS transistors squeeze each other. In this way, it is guaranteed that the PMOS transistors and the NMOS transistors have good electrical properties.

An embodiment of the present disclosure also provides a memory, which includes the wordline driver circuit described in any one of the above embodiments. In the context of increasingly miniaturized integrated circuits, the use of the wordline driver circuit with the above structure is beneficial to improve the electrical properties of the transistors and the wordlines, such that the electrical properties of the wordline driver circuit are improved, and thus overall properties of the memory are improved.

Those of ordinary skill in the art can understand that the above-mentioned embodiments are some embodiments for realizing the present disclosure, but in practical applications, various changes can be made to them in form and details without departing from the spirit and scope of the present disclosure. Any person skilled in the art can make their own changes and modifications without departing from the spirit and scope of the present disclosure. Therefore, the protection scope of the present disclosure shall be subject to the scope defined by the claims.

What is claimed is:

1. A wordline driver circuit, comprising:
a first type of wordline drivers and a second type of wordline drivers, each of the wordline drivers comprising a P-channel metal oxide semiconductor (PMOS) transistor and an N-channel metal oxide semiconductor (NMOS) transistor, a first type of PMOS transistors in the first type of wordline drivers and a second type of PMOS transistors in the second type of wordline drivers being configured to receive different first control signals;

wherein the first type of PMOS transistors and the second type of PMOS transistors are arranged side by side, a part of the NMOS transistors in the first type of wordline drivers and the second type of wordline drivers being positioned on a side of the first type of PMOS transistors and the second type of PMOS transistors, and other part of the NMOS transistors in the first type of wordline drivers and the second type of wordline drivers being positioned on other side of the first type of PMOS transistors and the second type of PMOS transistors.

2. The wordline driver circuit according to claim 1, wherein each of the PMOS transistors comprises at least two sub PMOS transistors.

3. The wordline driver circuit according to claim 2, wherein an arrangement direction of the first type of PMOS transistors and the second type of PMOS transistors is perpendicular to a channel length direction of the PMOS transistors.

4. The wordline driver circuit according to claim 3, wherein the arrangement direction of the two sub PMOS transistors is parallel to the channel length direction of the PMOS transistor.

5. The wordline driver circuit according to claim 4, wherein the two sub PMOS transistors share a same source.

6. The wordline driver circuit according to claim 4, wherein the first type of wordline drivers comprise a first wordline driver and a third wordline driver, the first wordline driver comprising a first PMOS transistor, the third wordline driver comprising a third PMOS transistor, and the arrangement direction of the first PMOS transistor and the third PMOS transistor being perpendicular to the channel length direction of the PMOS transistors.

7. The wordline driver circuit according to claim 6, wherein the first PMOS transistor and the third PMOS transistor share a same gate.

8. The wordline driver circuit according to claim 3, wherein the channel length direction of the PMOS transistors is parallel to that of the NMOS transistors.

9. The wordline driver circuit according to claim 3, wherein the channel length direction of the PMOS transistors is perpendicular to that of the NMOS transistors.

10. The wordline driver circuit according to claim 2, wherein an arrangement direction of the first type of PMOS transistors and the second type of PMOS transistors is parallel to a channel length direction of the PMOS transistors.

11. The wordline driver circuit according to claim 10, wherein the arrangement direction of the two sub PMOS transistors is perpendicular to the channel length direction of the PMOS transistors.

12. The wordline driver circuit according to claim 10, wherein the first type of wordline drivers comprise a first wordline driver and a third wordline driver, the second type of wordline drivers comprising a second wordline driver and a fourth wordline driver, a first PMOS transistor comprised in the first wordline driver and a second PMOS transistor comprised in the second wordline driver sharing a source, and a third PMOS transistor comprised in the third wordline driver and a fourth PMOS transistor comprised in the fourth wordline driver sharing the source.

13. The wordline driver circuit according to claim 12, wherein the first PMOS transistor comprises a No. 11 PMOS transistor and a No. 12 PMOS transistor, the third PMOS transistor comprising a No. 31 PMOS transistor and a No. 32 PMOS transistor, a gate of the No. 11 PMOS transistor, a gate of the No. 12 PMOS transistor, a gate of the No. 31 PMOS transistor, and a gate of the No. 32 PMOS transistor being in a same straight line.

14. The wordline driver circuit according to claim 13, wherein the second PMOS transistor comprises a No. 21 PMOS transistor and a No. 22 PMOS transistor, the fourth PMOS transistor comprising a No. 41 PMOS transistor and a No. 42 PMOS transistor, the No. 21 PMOS transistor and the No. 11 PMOS transistor sharing the same source, the No. 22 PMOS transistor and the No. 12 PMOS transistor sharing the same source, the No. 41 PMOS transistor and the No. 31 PMOS transistor sharing the same source, and the No. 42 PMOS transistor and the No. 32 PMOS transistor sharing the same source.

15. The wordline driver circuit according to claim 13, wherein the No. 31 PMOS transistor and the No. 32 PMOS transistor are both positioned between the No. 11 PMOS transistor and the No. 12 PMOS transistor.

16. The wordline driver circuit according to claim 13, wherein the No. 11 PMOS transistor and the No. 12 PMOS transistor are both positioned between the No. 31 PMOS transistor and the No. 32 PMOS transistor.

17. The wordline driver circuit according to claim 2, wherein an arrangement direction of the first type of PMOS transistors and the second type of PMOS transistors is parallel to a channel length direction of the PMOS transistors and a channel length direction of the NMOS transistors.

18. A memory comprising a wordline driver circuit, wherein the wordline driver circuit comprises:
a first type of wordline drivers and a second type of wordline drivers, each of the wordline drivers comprising a P-channel metal oxide semiconductor (PMOS) transistor and an N-channel metal oxide semiconductor (NMOS) transistor, a first type of PMOS transistors in the first type of wordline drivers and a second type of PMOS transistors in the second type of wordline drivers being configured to receive different first control signals;
wherein the first type of PMOS transistors and the second type of PMOS transistors are arranged side by side, a part of the NMOS transistors in the first type of wordline drivers and the second type of wordline drivers being positioned on a side of the first type of PMOS transistors and the second type of PMOS transistors, and other part of the NMOS transistors in the first type of wordline drivers and the second type of wordline drivers being positioned on other side of the first type of PMOS transistors and the second type of PMOS transistors.

* * * * *